(12) United States Patent
Arakawa

(10) Patent No.: US 6,356,338 B2
(45) Date of Patent: *Mar. 12, 2002

(54) SEMICONDUCTOR PRODUCTION SYSTEM WITH AN IN-LINE SUBSYSTEM

(75) Inventor: Kiyoshi Arakawa, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,708

(22) Filed: Jan. 6, 1999

(30) Foreign Application Priority Data

Jan. 8, 1998 (JP) ............................................. 10-002270

(51) Int. Cl.$^7$ ..................... G03B 27/52; G03B 27/42; C23C 16/00
(52) U.S. Cl. ........................ 355/30; 355/53; 118/719
(58) Field of Search ............................. 355/30, 72, 53; 118/719, 326, 715; 399/604; 437/192

(56) References Cited

U.S. PATENT DOCUMENTS

| 5,043,299 A | * | 8/1991 | Chang et al. | ................. 437/192 |
| 5,625,433 A | * | 4/1997 | Inada et al. | .................. 399/604 |
| 5,825,470 A | * | 10/1998 | Miyai et al. | ................... 355/72 |
| 5,871,587 A | * | 2/1999 | Hasegawa et al. | ........... 118/719 |
| 5,922,130 A | * | 7/1999 | Moser et al. | ................ 118/326 |

FOREIGN PATENT DOCUMENTS

| JP | 04 128702 | 4/1992 |
| JP | 04 139453 | 5/1992 |
| JP | 07 130613 | 5/1995 |

* cited by examiner

*Primary Examiner*—Russell Adams
*Assistant Examiner*—Peter B. Kim
(74) *Attorney, Agent, or Firm*—Fitzpatrick, Cella Harper & Scinto

(57) ABSTRACT

A semiconductor production system has an exposure apparatus, a coater-developer, and an in-line subsystem for connecting the exposure apparatus and the coater-developer. The in-line subsystem has a removing unit for removing gaseous chemical substances that enter from an in-line connecting section. The system has a shutter or an air curtain to suppress entry of gaseous chemical substances from the in-line connecting section.

12 Claims, 4 Drawing Sheets

SEMICONDUCTOR PRODUCTION SYSTEM WITH AN IN-LINE SUBSYSTEM

BACKGROUND OF THE INVENTION

1. Field of the Invention

The present invention relates to a semiconductor production system for use in the production of semiconductor devices.

2. Description of the Related Art

In the production process of semiconductor devices, such as IC, LSI, and liquid crystal panels, substrates such as semiconductor wafer substrates and glass substrates are subjected to many working steps. Among these steps, an exposure step for patterning, and a resist-coating step and a development step performed before or after the exposure step, are important steps in the production process for semiconductor devices. Known apparatuses for performing these steps are exposure apparatuses such as steppers and scanners, and coater-developers.

These apparatuses are used alone in some cases; however, in recent years, these apparatuses have been primarily used in in-line systems which automatically perform a series of steps including coating, exposure, and development of a photosensitive resist on substrates. In the in-line system, an exposure apparatus and a coater-developer are connected in a line, and a robot delivers substrates between the exposure apparatus and the coater-developer.

In a conventional in-line system, a chamber containing the exposure apparatus and a chamber containing the coater-developer have openings at their adjacent walls, and substrates are delivered by a robot hand through the openings. Optical units including mirrors and lenses arranged in a light source device and an illumination optical system are degraded during long-term operation of the in-line system, and thus the performance of the system will be degraded due to a decrease in, or unevenness of, illuminance of the exposure light. Clouding is apparent on optical components which are arranged near positions having high optical energy, such as the illuminating section of the light source and collimated sections in the optical system.

As disclosed in Japanese Patent Laid-Open Nos. 4-128702 and 4-139453, a primary component causing such clouding is ammonium sulfate $((NH_4)_2SO_4)$. Possible sources of the clouding are hexamethyldisilazane (HMDS) used as an adhesive promoter between a substrate and a resist, ammonia vapor released by concrete in the building, and sulfuric acid $(H_2SO_4)$ used for stripping the resist on the substrate. Since HMDS is used in the coater of the in-line system, it is likely that HMDS vapor enters the exposure apparatus through the opening for delivering the substrate when the pressure in the coater is higher than that in the chamber containing the exposure apparatus.

Japanese Patent Laid-Open No. 7-130613 discloses a countermeasure to the problem of gaseous materials entering the chamber containing the exposure apparatus from an open air inlet port; however, it does not solve the problem of the diffusion of gaseous materials through openings for delivering substrates in an in-line system.

SUMMARY OF THE INVENTION

Accordingly, it is an object of the present invention to provide a semiconductor production system that solves the above-mentioned problems.

It is another object of the present invention to provide a semiconductor production system having an in-line subsystem including an exposure apparatus and a coater-developer, in which high-accuracy devices can be produced by reducing amounts of chemical substances leaked from the inline connecting section.

It is a further object of the present invention to provide a method for making a device using the above-mentioned system.

A first aspect of the present invention is a semiconductor production system including an exposure apparatus, a coater-developer, and an in-line subsystem for connecting the exposure apparatus and the coater-developer, the in-line subsystem including a removing unit for removing gaseous chemical substances entering from an in-line connecting section.

Preferably, the removing unit removes gaseous chemical substances entering the exposure apparatus from the in-line connecting section.

Preferably, a space shielded from the exterior of the semiconductor production system is provided at a substrate delivery channel between the exposure apparatus and the coater-developer.

The removing unit may have an evacuation means for evacuating the space. Alternatively, the removing unit may supply clean air through a chemical filter that removes the gaseous chemical substances.

Preferably, the semiconductor production system further includes a detecting unit for detecting the concentration of the gaseous chemical substances in the space. Preferably, the detecting unit detects at least one of ammonium ions $(NH_4^+)$, sulfate ions $(SO_4^{2-})$, and ammonia $(NH_3)$.

Preferably, the detecting unit detects the gaseous chemical substances by an ion chromatographic method, a diffusion scriber-type ion chromatographic method, or a coloring tape method.

Preferably, an automatically movable shutter or an air-curtain generating mechanism is provided between the space and the exposure apparatus and/or between the space and the coater-developer.

The space may be provided between the exposure apparatus and the coater-developer. Alternatively, the space may be provided in the exposure apparatus or in the coater-developer.

Preferably, the exposure apparatus is contained in a chamber, and has an air conditioning unit for controlling the temperature of the chamber.

Preferably, the exposure apparatus has an excimer laser light source.

A second aspect of the present invention is a method for making a device by the above-mentioned semiconductor production system.

Further objects, features and advantages of the present invention will become apparent from the following description of the preferred embodiments with reference to the attached drawings.

DESCRIPTION OF THE PREFERRED EMBODIMENTS

Figure 1:
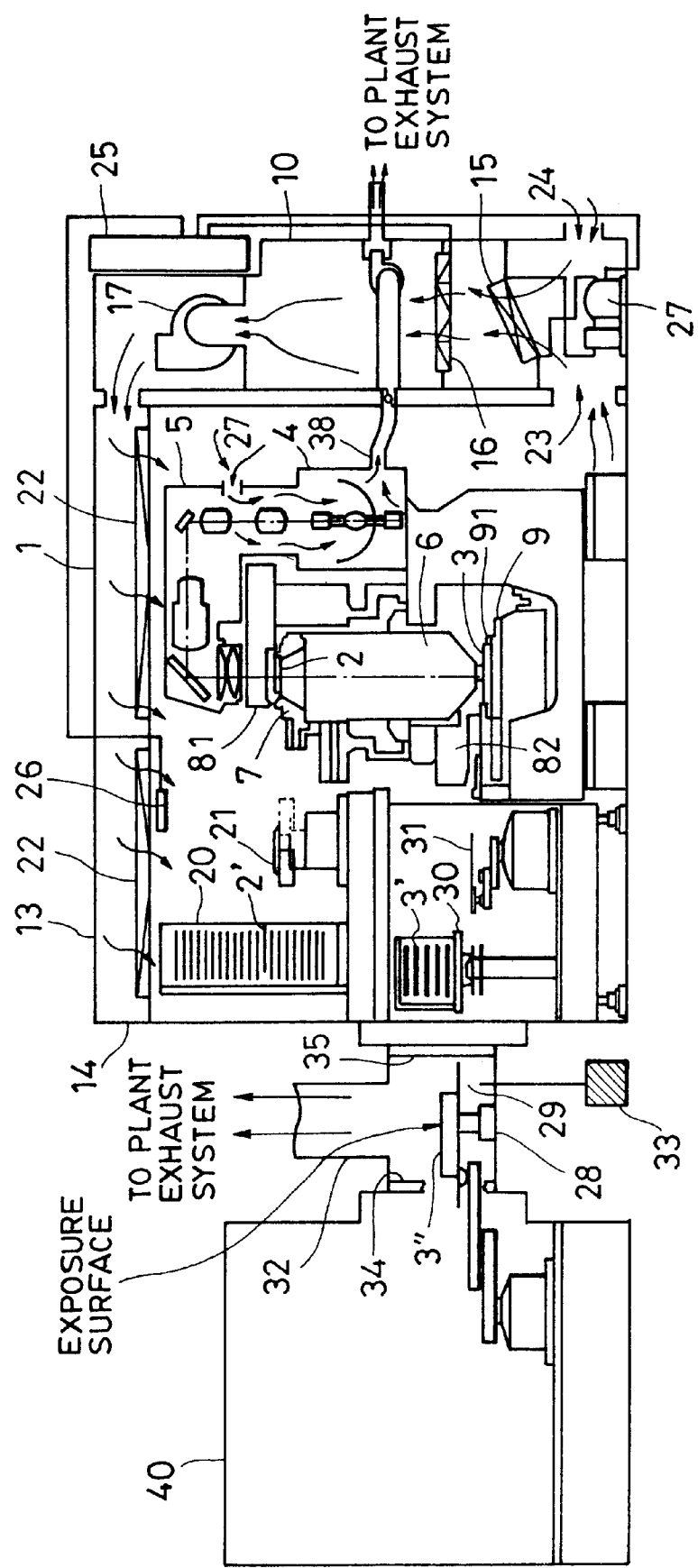
FIG. 1 is a schematic view of an in-line semiconductor exposure system in accordance with an embodiment of the present invention.

FIG. 1 is a schematic view of an in-line semiconductor production system in accordance with a preferred embodiment of the present invention, in which an exposure apparatus, that is, a stepper or a scanner, and a coater-developer are connected to each other.

The exposure apparatus includes an exposure apparatus chamber 1 containing the exposure apparatus. The light beams emerging from a light source unit 4 pass through an illuminating optical system 5, illuminate a reticle 2 as an original film to project a pattern of the reticle 2 onto a photosensitive layer on a substrate 3 by a projection lens 6. The light source unit 4 may be a visible light source composed of an ultrahigh-pressure mercury light, an elliptic mirror and lenses, or a ultraviolet light source composed of a KrF, ArF or $F_2$ excimer laser source and an optical system for shaping the laser beam into a predetermined shape.

A reticle stage 7 supports and moves the reticle 2. The substrate 3 is exposed to a vacuum on a substrate fixer 91. The substrate fixer 91 can move in cooperation with a substrate stage 9 in the longitudinal and transverse directions. A reticle optical system 81 is arranged above the reticle 2 and detects displacement of the reticle 2. An off-axis microscope 82 is arranged adjacent to the projection lens 6. The off-axis microscope 82 is a monocular microscope for observing non-exposure light (white light) and detects the relative position between the internal base mark of the off-axis microscope 82 and the alignment mark on the substrate 3.

A reticle library 20 and a substrate transfer elevator 30 are arranged as peripheral units adjacent to the exposure apparatus body. A required reticle and a required substrate are transferred into the exposure apparatus body by a reticle transfer unit 21 and a substrate transfer unit 31.

The exposure apparatus chamber 1 contains an air-conditioning unit for the exposure apparatus body and the peripheral units. The air conditioning unit includes an air-conditioning chamber 10, a filter box 13 for filtering fine foreign materials and forming a uniform stream of clean air, and a booth 14 for shielding the environment of the apparatus from the exterior. The temperature of the air is controlled by a cooler 17 and a heater 16 in the air-conditioning chamber 10, and then the air is supplied into the booth 14 through an air filter 22. The air in the booth 14 is circulated into the air-conditioning chamber 10 through a returning port 23. The system is not a completely-closed circulation system, because approximately 10% of the circulating air is continuously replenished by fresh air through an open-air inlet port 24 of the air-conditioning chamber 10 by a fan to maintain the positive pressure in the booth 14.

Since a part of the air in the booth 14 is exhausted by an exhaust system of the plant to cool the light source unit 4 and the like, an equal amount of fresh air must be supplied. Since the booth 14 is maintained at positive pressure, fine foreign materials from the exterior do not enter the booth 14 through fine gaps in the booth 14. The light source unit 4 is provided with an intake port 27, for cooling the ultrahigh-pressure mercury lamp and for taking precautions against generation of toxic gas due to abnormal operation of the laser unit and an exhaust port 38. A part of the air in the booth 14 is forcedly exhausted to the exhaust system of the plant by a fan in the air-conditioning chamber 10 via the light source unit 4. A controller 25 controls a cooling unit 17 based on the signals from a temperature sensor 26 to maintain the temperature of the blowing air constant.

The exposure apparatus and a coater-developer 40 in which a coater and a developer are integrated are connected by an in-line system. An in-line substrate delivery channel 28 is shielded from the open air and functions as a preparatory chamber 29. The preparatory chamber 29 is provided with an exhauster 32 for removing chemical substances entering from the coater-developer 40, and a monitor 33 for detecting the concentration of the chemical substances. The monitor 33 is of an ion chromatographic type, a diffusion scriber-type ion chromatographic type, or a coloring tape type, and detects ammonium ions ($NH_4^+$), sulfate ions ($SO_4^{2-}$) and ammonia ($NH_3$).

Two doors 34 and 35 are provided at both sides of the preparatory chamber 29. These doors D1 and D2 automatically open and close in response to signals indicating the delivery of substrates through the opening between the exposure apparatus and the coater-developer. Further, the doors 34 and 35 have an electrical locking mechanism, which closes, when the monitor 33 detects a concentration of a chemical substance, which is higher than a predetermined upper limit.

A substrate 3" delivered from the coater-developer 40 enters the preparatory chamber 29 via the door 34. Atmospheric gaseous chemical substances in the preparatory chamber 29 (the space closed by these doors) are removed. When the concentration of the gaseous chemical substances decreases to a predetermined lower limit, the door 35 opens to deliver the substrate 3" into the exposure apparatus. Also, before the substrate is moved from the exposure apparatus to the coater-developer, gaseous chemical substances are removed in the preparatory chamber 29. The gaseous substances in the preparatory chamber 29 are exhausted by the exhauster 32. Chemical substances, such as ammonium ions ($NH_4^+$) and sulfate ions ($SO_4^{2-}$), entering the exposure apparatus can thereby be effectively removed.

Gaseous chemical substances may also be removable by a chemical filter for adsorbing these substances, that is provided for feeding clean air to the substrate-delivery channel.

Figure 2:
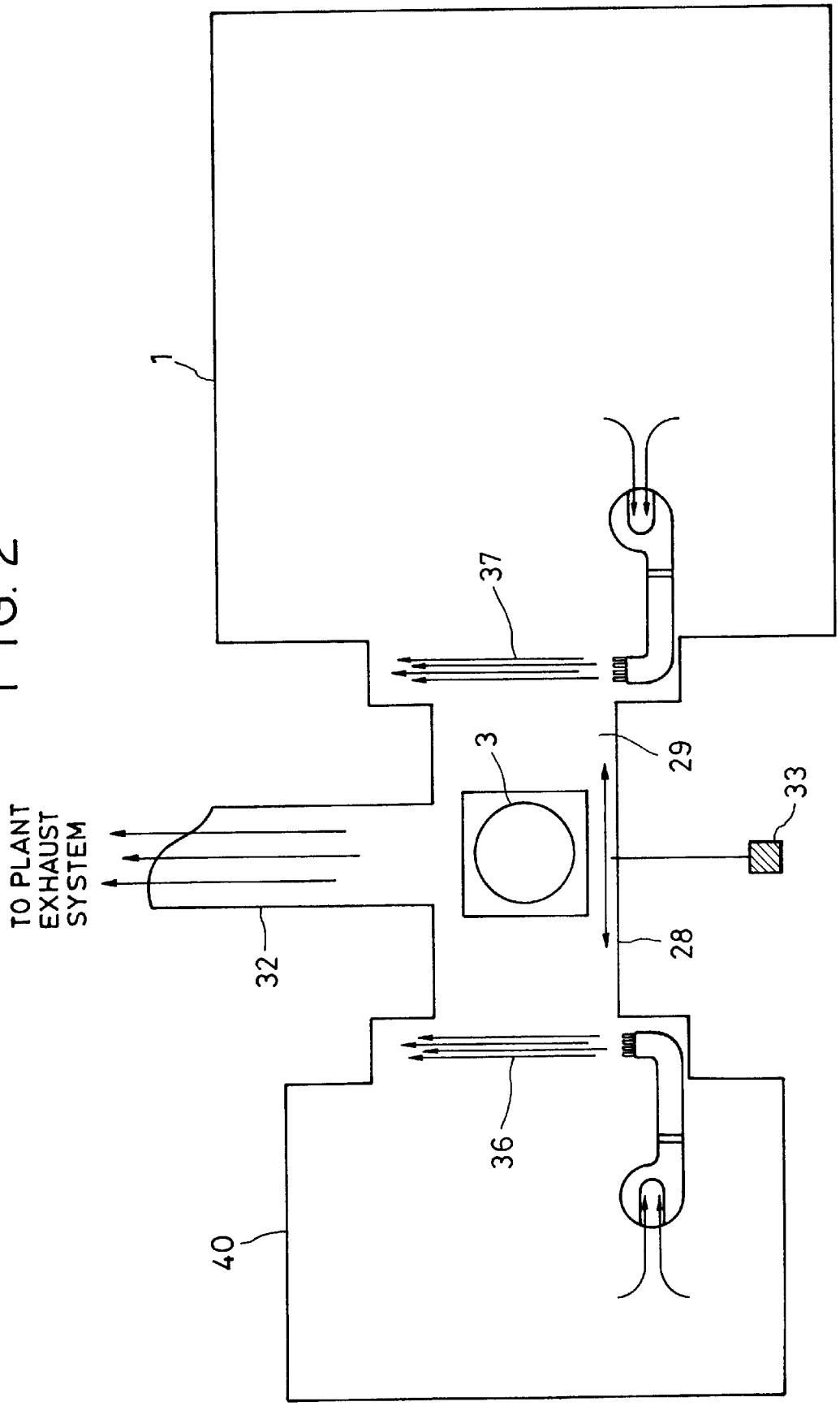
FIG. 2 is a schematic plan view of the main section of the in-line semiconductor exposure system of FIG. 1.

In an alternative embodiment, the doors 34 and 35 may be replaced with air curtains 36 and 37 that are placed at two positions, as shown in FIG. 2. These air curtains 36 and 37 can also effectively remove gaseous chemical substances contained in the exposure apparatus. It is preferable that the stream of the air curtains 36 and 37 be parallel to the substrate surface, since the parallel stream more effectively shields the exposure apparatus from the exterior due to low resistance against the stream. In contrast, a stream perpendicular to the substrate surface may not have satisfactory shielding effects due to high resistance against the stream. Thus, the air curtains 36 and 37 are perpendicularly formed with respect to the substrate surface, as shown in FIG. 2. Alternatively, the air curtains 36 and 37 may be formed in the orthogonal direction to the substrate surface.

As an alternative embodiment, the preparatory chamber may be provided in the exposure apparatus or in the coater-developer, instead of the interface between them.

As described above, a removing unit for removing gaseous chemical substances is provided in the substrate-delivery channel between the exposure apparatus and the coater-developer. The removing unit can prevent invasion of air containing gaseous chemical substances, such as ammonium ions ($NH_4^+$), sulfate ions ($SO_4^{2-}$), and ammonia ($NH_3$), into the exposure apparatus chamber. Thus, the removing unit can effectively suppress the formation of ammonium sulfate (($NH_4$)$_2SO_4$) causing clouding of the optical units in the light source device and the illumination optical system, and can maintain high illuminance of the exposure light for a long period.

The doors or air curtains, provided at the openings for shielding the substrate-delivery channel from the exterior, allow uniform air conditioning in the chamber. Thus, the exposure apparatus can produce semiconductor devices in a high yield for long periods. Since the pressure in the chamber is increased, the internal pressure of the clean room can be in a wide range.

Figure 3:
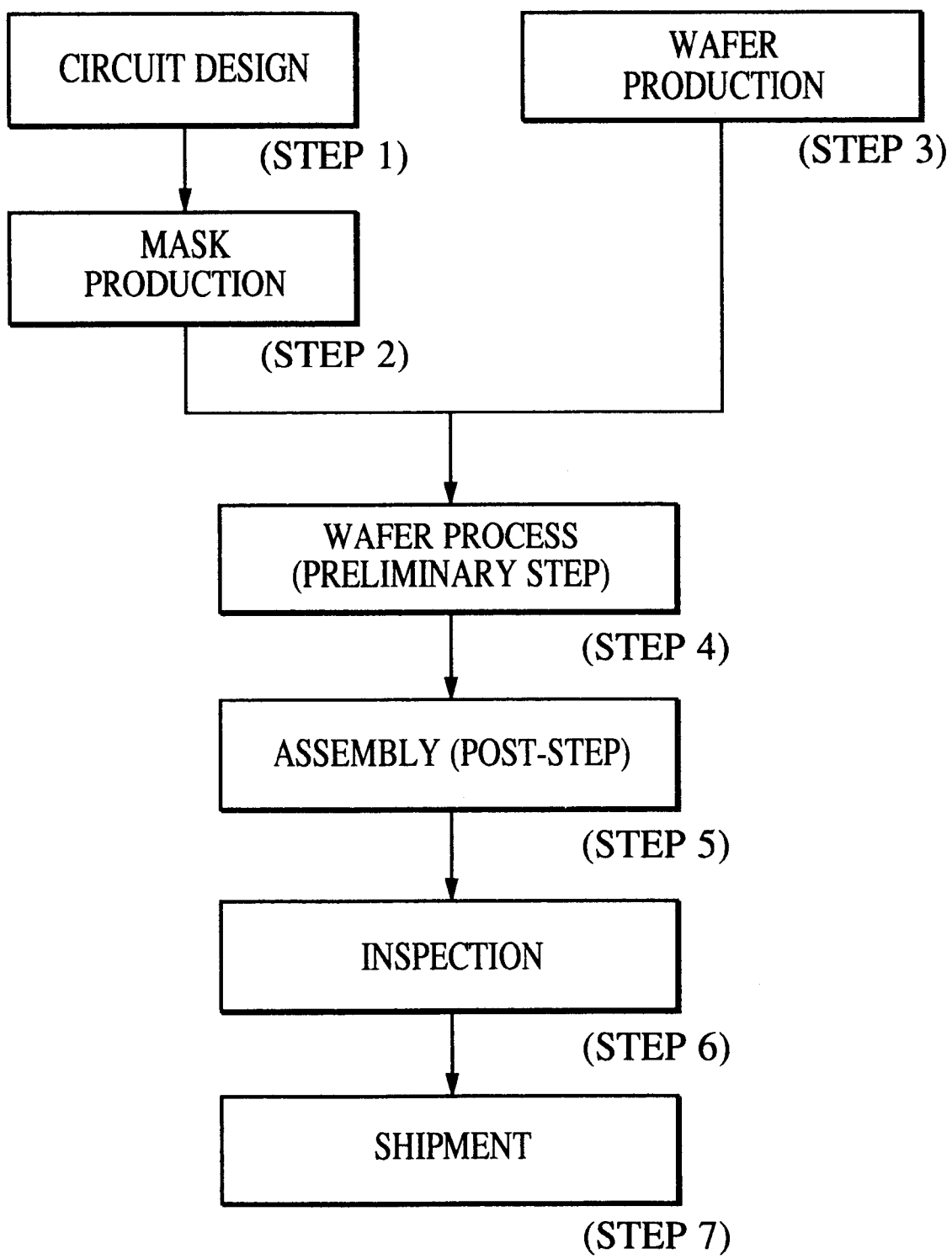
FIG. 3 is a flow chart showing production of a semiconductor device in accordance with the present invention.

An embodiment of a method for making a device using the above-described semiconductor production system will now be described. FIG. 3 is a flow chart showing production of a microdevice, for example, a semiconductor chip such as an IC or LSI, a liquid crystal panel, a CCD, a thin-film magnetic head, and a micromachine, in accordance with the present invention. In step 1 (circuit design), a device pattern is designed, and in step 2 (mask production), a mask having the designed pattern is produced. On the other hand, a substrate is formed of silicon or glass in step 3 (substrate production). In step 4 (wafer process or preliminary step), a circuit is formed on the substrate through the mask by a lithographic process. In step 5 (assembly or post step), a semiconductor chip is produced from the substrate. The assembly step includes a dicing substep, a bonding substep, and a packaging or chip-sealing substep. In step 6 (inspection), the resulting semiconductor device is subjected to operational testing and durability testing. The final semiconductor device products are shipped in step 7 (shipment).

Figure 4:
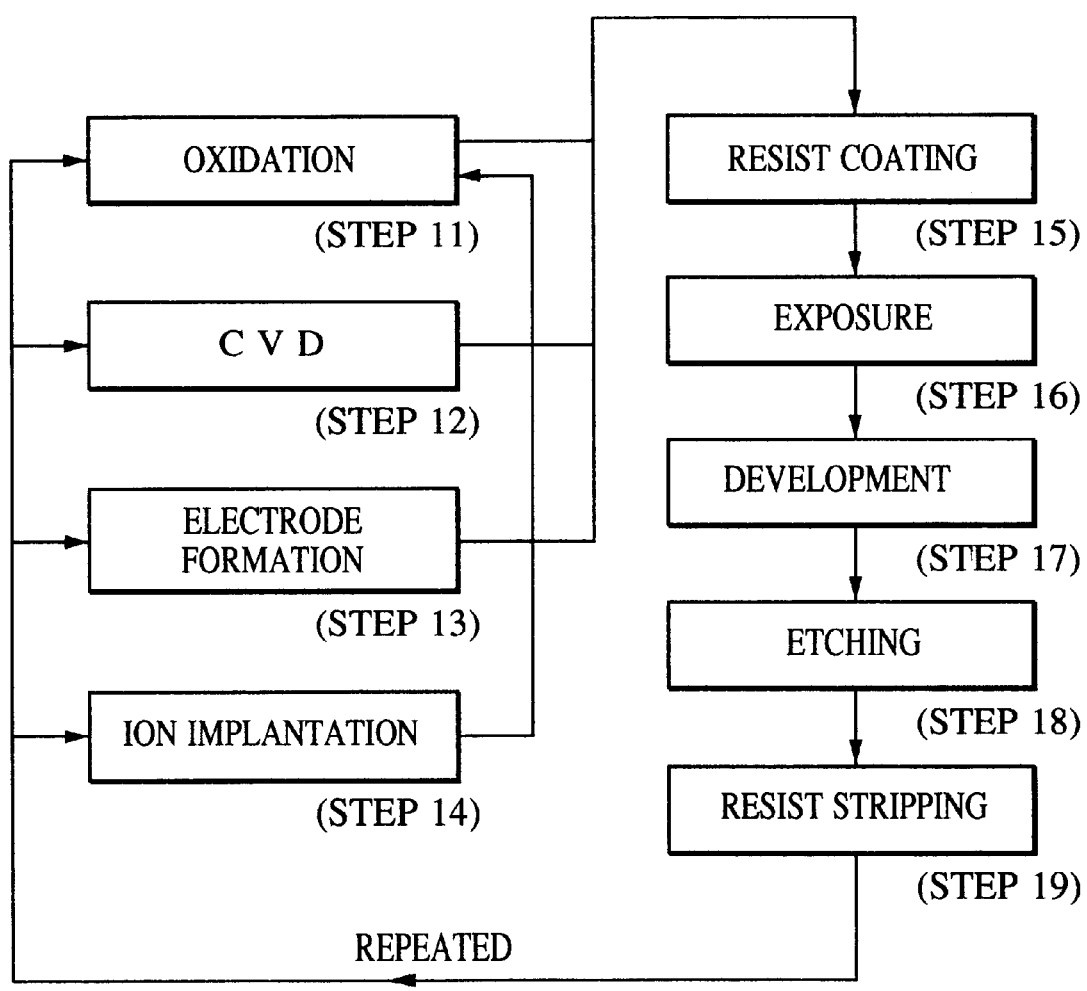
FIG. 4 is a flow chart of detailed steps of a wafer process.

FIG. 4 is a flow chart of detailed steps of the wafer process. The substrate surface is oxidized in step 11 (oxidation), and an insulating film is formed on the substrate surface in step 12 (CVD: chemical vapor deposition). An electrode is formed on the substrate by a vapor deposition process in step 13 (electrode formation), and ions are implanted into the substrate in step 14 (ion implantation). A resist is applied on the substrate in step 15 (resist coating), and the circuit pattern of the mask is arranged on the substrate to expose the resist in step 16 (exposure). The exposed substrate is developed in step 17 (development), and the undeveloped portion other than the resist image is etched in step 18 (etching). The residual resist is removed in step 19 (resist stripping). These steps are repeated to form a multiple circuit pattern on the substrate. The production method in accordance with the present invention can produce high-accuracy devices with low costs that have not been able to produce by conventional processes.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A semiconductor production system comprising:
   an exposure apparatus for an exposing process, said exposure apparatus comprising optical instruments;
   a coater-developer for a coating process and a developing process, said coater-developer capable of being a source of gaseous chemical substances capable of degrading the optical instruments; and
   an in-line subsystem, disposed between the exposure apparatus and the coater-developer, providing a delivery channel for delivering a substrate between the exposure apparatus and the coater-developer, said in-line subsystem comprising a detector for detecting the gaseous chemical substances in the delivery channel and a device for preventing the gaseous chemical substances from entering the exposure apparatus from the delivery channel in response to gaseous chemical detection signals from the detector.

2. A semiconductor production system according to, claim 1, wherein said device comprises means for removing gaseous chemical substances, generated in the coater-developer, from entering the exposure apparatus through the delivery channel.

3. A semiconductor production system according to claim 2, wherein the delivery channel comprises a preparatory chamber shielded from an outside atmosphere.

4. A semiconductor production system according to claim 1, wherein said device comprises an exhauster that exhausts gases from the delivery channel.

5. A semiconductor production system according to claim 1, wherein said device comprises a chemical filter that absorbs the gaseous chemical substances.

6. A semiconductor production system according to claim 3, wherein the detector detects at least one of ammonium ions ($NH_4^+$), sulfate ions ($SO_4^{2-}$), and ammonia ($NH_3$).

7. A semiconductor production system according to claim 3, wherein the detector detects the gaseous chemical substances by an ion chromatographic method, a diffusion scrubber-type ion chromatographic method or a coloring tape method.

8. A semiconductor production system according to claim 3, wherein said device comprises a shutter at at least one of a first position between the delivery channel and the exposure apparatus and a second position between the delivery channel and the coater-developer, wherein the shutter is controlled based on data from the detector.

9. A semiconductor production system according to claim 1, wherein said device comprises an air-curtain generator for generating an air-curtain at at least one of a first position between the delivery channel and the exposure apparatus and a second position between the delivery channel and the coater-developer.

10. A semiconductor production system according to claim 3, wherein the preparatory chamber is provided between the exposure apparatus and the coater-developer.

11. A semiconductor production system according to claim 1, wherein the exposure apparatus is contained in a chamber, and has an air conditioning unit for controlling the temperature of the chamber.

12. A semiconductor production system according to claim 1, wherein the exposure apparatus includes an excimer laser light source.

* * * * *

UNITED STATES PATENT AND TRADEMARK OFFICE
CERTIFICATE OF CORRECTION

PATENT NO. : 6,356,338 B2  Page 1 of 1
DATED : March 12, 2002
INVENTOR(S) : Kiyoshi Arakawa It is certified that error appears in the above-identified patent and that said Letters Patent is hereby corrected as shown below:

<u>Title page,</u>
Item [56], US. PATENT DOCUMENTS, "Moser, et al." should read -- Mosser et al. --.
Item [56], FOREIGN PATENT DOCUMENTS,
"04 128702" should read -- 4-128702 --;
"04 139453" should read -- 4-139453 --; and
"04 130613" should read -- 4-130613 --.

<u>Column 1,</u>
Line 21, "cases; however," should read -- cases. However, --.

<u>Column 2,</u>
Line 4, "inline" should read -- in-line --.

<u>Column 5,</u>
Line 47, "produce" should read -- be produced --.

<u>Column 6,</u>
Line 15, "to," should read -- to --.

Signed and Sealed this

Twenty-second Day of October, 2002

Attest:

JAMES E. ROGAN
*Attesting Officer*   *Director of the United States Patent and Trademark Office*